(12) United States Patent
Zibold et al.

(10) Patent No.: US 8,268,516 B2
(45) Date of Patent: Sep. 18, 2012

(54) METHOD FOR REPAIRING PHASE SHIFT MASKS

(75) Inventors: Axel Zibold, Jena (DE); Peter Kuschnerus, Jena (DE); Oliver Kienzle, Jenna (DE)

(73) Assignee: Carl Zeiss SMS GmbH, Jena (DE)

( * ) Notice: Subject to any disclaimer, the term of this patent is extended or adjusted under 35 U.S.C. 154(b) by 187 days.

(21) Appl. No.: 12/742,741

(22) PCT Filed: Nov. 14, 2008

(86) PCT No.: PCT/EP2008/009640
§ 371 (c)(1),
(2), (4) Date: May 13, 2010

(87) PCT Pub. No.: WO2009/062728
PCT Pub. Date: May 22, 2009

(65) Prior Publication Data
US 2010/0266937 A1    Oct. 21, 2010

(30) Foreign Application Priority Data
Nov. 17, 2007    (DE) .................. 10 2007 054 994

(51) Int. Cl.
*G03F 1/72*    (2012.01)
*G06K 9/00*    (2006.01)
*G01N 21/00*    (2006.01)

(52) U.S. Cl. .................. 430/5; 382/144; 356/237.5

(58) Field of Classification Search .......... 430/5, 30, 430/322, 394; 382/144; 716/50, 52; 356/237.5
See application file for complete search history.

(56) References Cited

U.S. PATENT DOCUMENTS

| | | | |
|---|---|---|---|
| 5,965,306 A | 10/1999 | Mansfield et al. | |
| 6,016,357 A | 1/2000 | Neary et al. | |

(Continued)

FOREIGN PATENT DOCUMENTS

| | | |
|---|---|---|
| DE | 10 2005 048 107 | 7/2006 |
| DE | 10 2005 009 536 | 8/2006 |

OTHER PUBLICATIONS

International Search Report for International Application No. PCT/EP2008/009640 dated Jan. 29, 2009.

(Continued)

*Primary Examiner* — Stephen Rosasco
(74) *Attorney, Agent, or Firm* — Fish & Richardson P.C.

(57) ABSTRACT

The invention relates to a method for repairing phase shift masks for photolithography in which a phase shift mask is checked for the presence of defects and, if defects are present, (i) an analysis is conducted as to which of the defects negatively affect imaging properties of the phase shift mask, (ii) said defects are improved, (iii) the imaging properties of the improved phase shift mask are analyzed and the maintenance of a predetermined tolerance criterion is checked, and (iv) the two preceding steps (ii) and (iii) are optionally repeated multiple times if the imaging properties do not meet the predetermined tolerance criterion. In such a method, the imaging properties are analyzed in that, for each defect to be improved, a test variable is determined for the defect as a function of focus and illumination, and at least one additional non-defective point on the phase shift mask in the immediate vicinity of the defect is determined, and a minimum allowable deviation between the test variable for the defect and the non-defective point is predetermined as the tolerance criterion.

20 Claims, 2 Drawing Sheets

U.S. PATENT DOCUMENTS

| | | | |
|---|---|---|---|
| 6,660,436 | B1 | 12/2003 | Chen et al. |
| 7,094,507 | B2 | 8/2006 | Hirscher et al. |
| 2002/0164065 | A1 | 11/2002 | Cai et al. |
| 2004/0157134 | A1 | 8/2004 | Kim et al. |
| 2005/0153213 | A1* | 7/2005 | Schulze et al. .................... 430/5 |
| 2005/0204322 | A1* | 9/2005 | Kotani et al. ................... 716/10 |
| 2008/0247632 | A1 | 10/2008 | Boehm et al. |
| 2010/0081068 | A1* | 4/2010 | Kim ................................. 430/5 |

OTHER PUBLICATIONS

German Search Report for Application No. 10 2007 054 994.8 dated Jun. 27, 2008.

William Chou et al., "Characterization of Repairs to KrF 300mm Wafer Printability for 0.13um Design Rule with Attenuated Phase Shifting Mask", *Proceedings of SPIE*, vol. 4889, pp. 498-508 (2002).

Thomas Scherübl et al., "Advanced Photomask Repair and Verification", *Microlithography World*, vol. 16, No. 2, pp. 15-18 (May 2007).

Axel M. Zibold et al., "Advances in hardware, software and automation for 193nm aerial image measurement systems", *Proceedings of SPIE*, vol. 5752, No. 1, pp. 1042-1049 (2005).

* cited by examiner

METHOD FOR REPAIRING PHASE SHIFT MASKS

CROSS REFERENCE TO RELATED APPLICATION

This application is the National Stage International Application No. PCT/EP2008/009640, filed on Nov. 14, 2008, which claims priority to German Patent Application Serial No. 10 2007 054 994.8, filed on Nov. 17, 2007. The contents of these applications are hereby incorporated by reference in their entireties.

DESCRIPTION

The invention is directed to a method for repairing phase shift masks for photolithography, in which a phase shift mask is inspected for the presence of defects and, if defects are present, (i) an analysis is performed to determine which of the defects adversely affect imaging properties of the phase shift mask, (ii) those defects are touched up, (iii) the imaging properties of the touched-up phase shift mask are analyzed and adherence to a predefined tolerance criterion is checked, and (iv) the two previous steps, (ii) and (iii), are repeated as many times as necessary if the imaging properties do not meet the predefined tolerance criterion.

The production of photolithography masks of the kind used to fabricate integrated circuits on wafers is labor- and cost-intensive. The photolithography scanners commonly used for wafer exposure today are operated at a wavelength of 193 nm. The trend, however, is toward ever-smaller structures, so ways and means of increasing resolution are being sought. One such means is the use of "phase shift masks" (PSMs). The light passing through this type of mask is varied not only in intensity, but also in phase. The use of phase shift masks in combination with high numerical aperture exposure and specially adapted illumination conditions currently increases resolution for optical photolithography to as much as 40 nm. The smaller the structures to be created, the greater the significance of defects in the mask structure. Since mask fabrication is laborious and costly, the analysis and repair of masks plays an increasingly important role in their production and verification.

However, standard inspection methods, such as irradiation with white light, do not lend themselves to the inspection of phase shift masks. With phase shift masks, defects that look transparent or opaque when so irradiated may, when the actual patterning is done, take on a different appearance or, for example, not be visible at all. Under these circumstances, the first step, nevertheless, is usually to examine the mask in an inspection system in order to obtain a complete list of all the defects. This includes a die-to-die/database comparison performed by high-resolution imaging. In a next step, however, an analysis must be performed to determine which of the defects adversely affect the imaging properties of the phase shift mask, that is, alter the imaging properties in such a way that the desired structure lies outside the predefined tolerances during a printing operation, i.e., the exposure of a wafer coated with photoresist. This analysis can be performed, for example, with a mask emulation system such as the AIMS (Aerial Image Measurement System).

Thus, only defects that also have a negative effect on the imaging properties are touched up in a repair system. The imaging properties of the touched-up phase shift mask are then analyzed again, for example in an AIMS. If the imaging properties now satisfy a predefined tolerance criterion, then the repair can be considered successful; otherwise, the defects are touched up again and the imaging properties re-analyzed. These first two steps can be repeated as many times as necessary. The tolerance criterion adopted can be, for example, a maximum possible constriction or thickening of a linear structure as it would appear on the wafer. This can be inspected, for example, in an image generated with the AIMS using what is known as "best focus." In the prior art, repairs are then performed or repaired sites are modified until the repaired site is within tolerance under "best focus."

With the use of phase shift masks, however, the prior art methods reach their limitations. Such masks, i.e., the structures applied to the mask substrate material (the mask blank), usually consist of a molybdenum/silicon (MoSi) alloy, but if material has to be added, then another material is normally used for the repair, since the deposition of MoSi alloy is a difficult to impossible operation. When another material is used, however, the optical properties change at that location, so the phase permeability or the transmission at that site will differ from what they are at other sites. The neighborhood of the defect can also influence optical behavior.

Even when the defect is successfully eliminated and a repaired structure is seen under best possible focus, this is true only at that focus setting. During the use of the mask in wafer production, this condition must be painstakingly adhered to, since otherwise, more or less substantial deviations can occur.

The object of the invention is, therefore, to refine a method of the initially described kind in such a way that the user is permitted greater tolerances with regard to focusing during wafer production.

This object is achieved, in a method of the initially described kind, by the fact that the imaging properties are analyzed by defining, for each of the defects to be touched up, a test quantity as a function of focus and exposure for the defect and at least one other, non-defect site on the phase shift mask in the immediate vicinity of the defect, and by the fact that a minimum allowable deviation of the test quantities for defect and non-defect sites is taken as a tolerance criterion.

The test quantity thus is a quantity or function that depends at least on the two variables focus and exposure. A tolerance criterion that encompasses focus and exposure can then be specified for each value of the test quantity. The tolerance criterion is met when the test quantity for the defect is within the tolerance for exposure and focus of the correlative test quantity for the non-defect site.

The test quantities, such as, for example, the critical dimension (CD) or the exposure tolerance, can advantageously be analyzed by means of Bossung curves. These can be determined as a function of the focus setting for different exposures, thus yielding a family of Bossung curves with the exposure tolerance or the CD as a parameter. From this family of curves, it is possible to define as the tolerance criterion a range of focus settings and exposures within which the critical dimension meets the requirements in the case of non-defect sites.

After the Bossung curves have been determined for the non-defect site, the defect site is examined. Here again, a range can be specified in which the best possible adherence to the tolerance criteria is achieved in the case of the defect, even if the critical dimension may not satisfy the requirements in some cases. By touching up the phase shift mask at the defect, an attempt is then made to—insofar as possible—bring these tolerance ranges into agreement, or make the Bossung curves coincide. To this end, the above-cited steps (ii) and (iii) are repeated until, iteratively, the difference between the two tolerance ranges is so small that both for focus and for exposure time, certain deviations from the ideal values—at which, in the case of Bossung curves, the slope of these curves is zero—are feasible without any degradation of quality. The tolerance criterion is therefore set when the deviation of the test quantity of the defect from the test quantity for the non-defect site is so small that the values of the test quantities for the defect are within the tolerance range of the test quantity with no defect.

It is important here that the defect and the non-defect site be in immediate proximity to each other, since the defect site can enter into optical interaction with the non-defect sites, that is, the optical transmission properties may influence the non-defect site as well. It is therefore advantageous to have the comparison include more than one non-defect site in the immediate vicinity, the number of neighboring sites usefully being limited to four in order to keep expenditure as low as possible while still maintaining high precision. The distance between these sites must be large enough so that the optical image of the non-defect site is not overlain by the effect of the defect site, i.e., there should be no convolution.

In a particularly preferred embodiment of the method, process windows are defined for the test quantities, and a minimum overlap of the process windows is taken as the tolerance criterion. Such a process window is obtained by plotting a test quantity—such as, for example, the critical dimension or the exposure tolerance—as a function of exposure and focus. Allowing for external constraints, such as the photoresist used, the wavelength, etc., the graphic representation of the curves can then be used to define process windows, i.e., a range for exposure and focus within which a structure can be generated with a predetermined precision.

Said process windows must be determined both for the defect and for the neighboring sites that are not defective. The process window or windows of a defect that becomes observable when the photoresist-coated wafer is exposed usually have little or no overlap with the process windows of the non-defect sites, which ideally are all identical. If the process windows concerned do not overlap, then there is no range, relative to exposure and focus, in which the wafer can be satisfactorily exposed so that the defect does not become observable. Only when the process windows for defect and non-defect sites overlap does a range exist within which there are exposure and focus settings that will make the defect on the exposed structure invisible, even if the defect may not be optimally corrected.

Hence, touch-up is an iterative process aimed at bringing the process windows for defect and non-defect sites into the greatest possible overlap. A minimum overlap of the process windows is taken as the tolerance criterion; this minimum overlap can be stated as a percentage and its choice is guided by the specific inputs of the wafer fabrication process; it is usually around 90%.

To be able to represent the test quantities suitably as a function of focus, it is useful to determine these values by generating image stacks of patterns of the phase shift mask taken in various planes around and parallel to the focal plane. This "through-focus image stack," which covers at least the range of the depth of field, can be generated, for example, directly in the AIMS mask emulation system. While the situation in the photolithography scanner is being emulated in the AIMS, images can also be taken at other wavelengths and then analyzed by means of a scanner simulation program. Such image stacks can also be generated by scanning electron microscopy.

Alternatively, process windows can also be derived by test-printing the wafer and then performing a critical dimension analysis under the scanning electron microscope. This method is more time-consuming, however.

To touch up the defects, material is either applied or removed. Applied material can differ from the material of already existing structures in terms of its optical properties, such as transmission or phase permeability; for example, it is feasible to apply material with a transmission of 6% or 18%, but also light-impermeable material. Material can be removed from existing structures, or substrate material can be removed from the mask. The existing structures concerned can be the product of previous repair steps. The layer thickness of existing structures can also be changed by removing or applying material in order to modify the optical properties.

Finally, in a particularly preferred embodiment of the method, the defect is touched up by adding what are known as OPC structures (optical proximity correction structures). Here, the repair can be based exclusively on the use of such OPC structures, but advantageously an attempt is first made to touch up the defect with a material which in terms of its optical properties is the closest possible match to the base material of the mask structure, so as to complete the iterative repair process in as few steps as possible.

The advantage of using OPC structures is that different materials which may be easier to apply than the original mask material can be used for rough touch-up of the defect, for example a gap in a line. In a fine-tuning operation, the optical properties can then be adjusted by adding OPC structures such that the process windows of the defect site and the neighboring non-defect sites overlap within the tolerance criterion. This addition of OPC structures can take the form not only of applying material, but also of removing material, for example by cutting a trench in the mask material. This embodiment of the method substantially increases the ease of mask repair.

The inventive method makes it possible to correct defect sites easily in such a way that the user is provided a certain latitude in terms of exposure and focus, so that the wafer structure generated in this fashion is still usable even if the best possible focus or the best possible exposure are not attained.

The invention will be described in more detail below with reference to an exemplary embodiment. In the accompanying drawings.

Figure 3A:
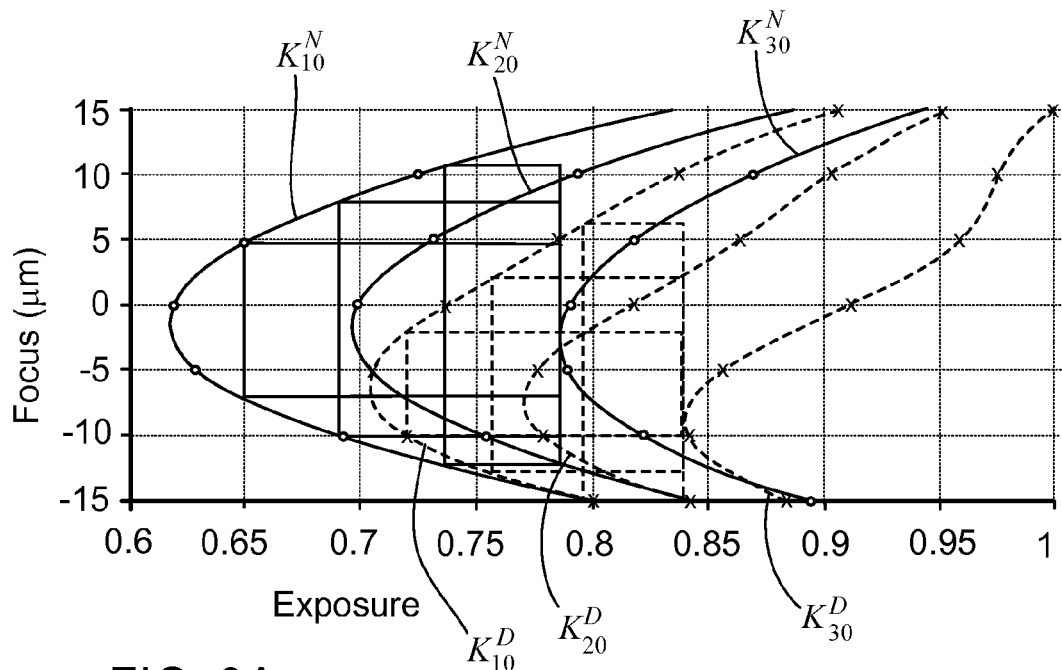
Figure 3B:
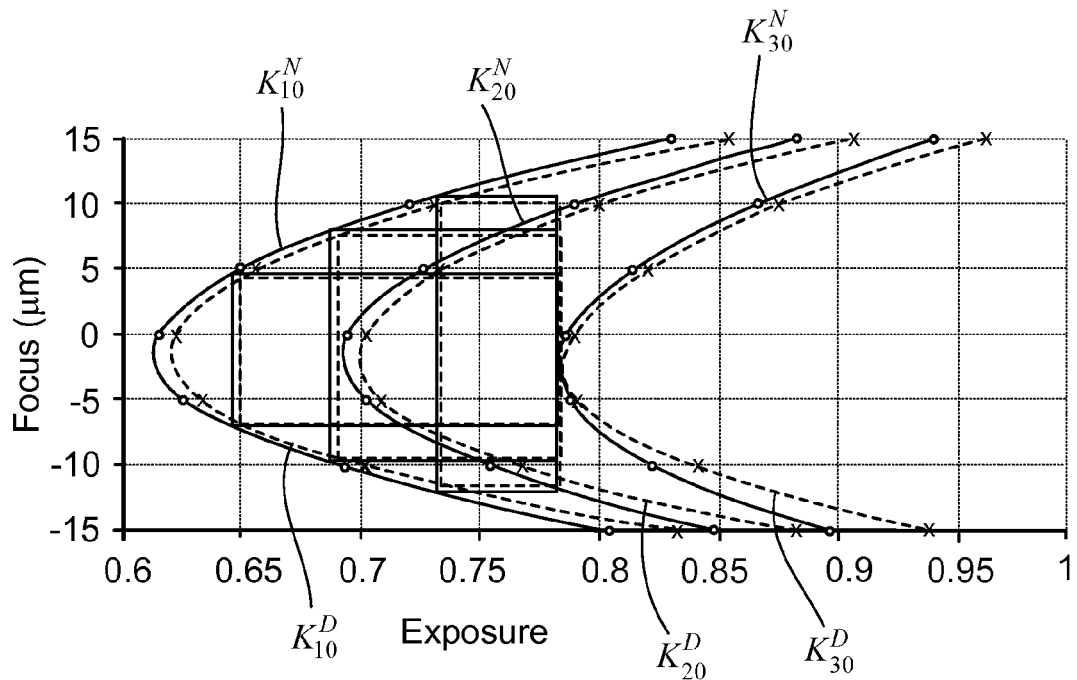

FIG. 3a exemplarily illustrates a process window for an untouched-up defect and its neighbor sites, and FIG. 3b shows the equivalent process window with the defect touched up.

Figure 1:
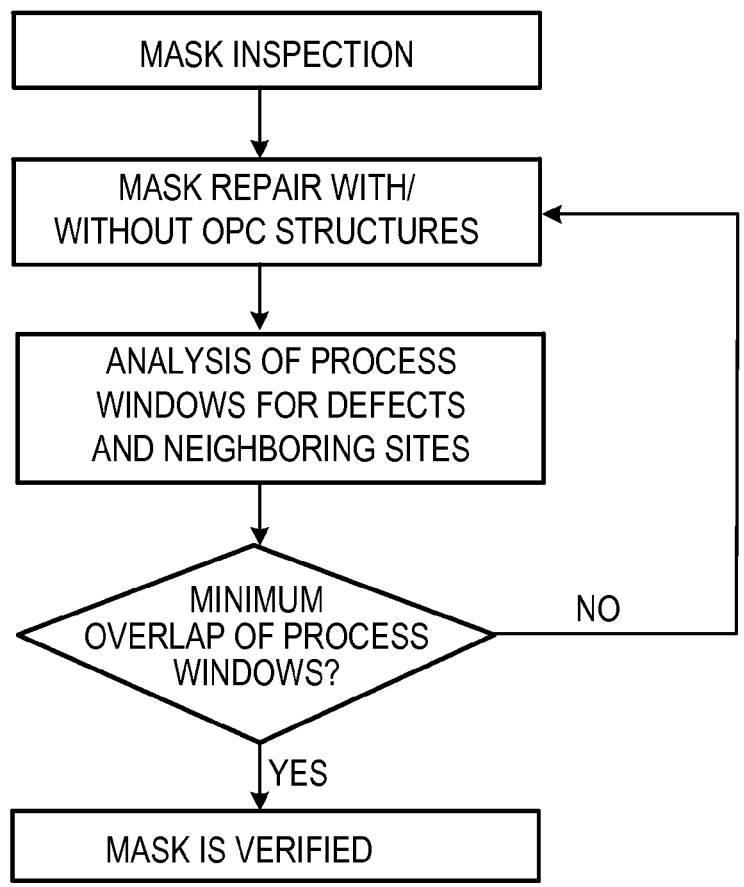
FIG. 1 is a flow chart of the method according to the invention.

To begin with, FIG. 1 outlines the basic sequence of the method. In a first step, a mask is placed in a mask inspection system and inspected for the presence of defects. The defects present are also analyzed by the inspection system to determine whether they adversely affect imaging properties of the phase shift mask. This can be checked via the test production of a wafer or, alternatively, with a mask emulation system such as the AIMS, manufactured by Zeiss. In both cases, a list is obtained that gives the defects that must be repaired to ensure that the phase shift mask has full functionality. These defects are then touched up consecutively in a mask repair system. So-called OPC structures (optical proximity correction structures) may, optionally, also be added to make the repairs. In addition to the application of material, material can also, of course, be removed.

In the next step, values of test quantities are determined, said test quantities being dependent on focus and exposure. Particularly suitable for use as the test quantity are, for example, the critical dimension or the tolerance with respect to exposure. In the next step, a check is then performed to determine whether the imaging properties correspond to a predefined tolerance criterion. When process windows are being determined for the test quantities, a minimum overlap of the process windows is taken as the tolerance criterion, the minimum necessary overlap potentially depending on the mask material, the photoresist and other system properties or parameters that govern the photolithography process. This minimum overlap of the process windows defines the range with regard to focus and exposure in which, for example, a structure with a diameter of 100 nm to 10 nm can be generated precisely and the imaging properties consequently fall within a tolerable range. The tolerance criterion thus corresponds to a precision with which structures can be patterned on a wafer.

If the minimum overlap is adequate, i.e., if the required precision is attained, then the mask can be verified and used for the photolithography process. If the required tolerances are not met, then the mask is returned to mask repair.

Figure 2:
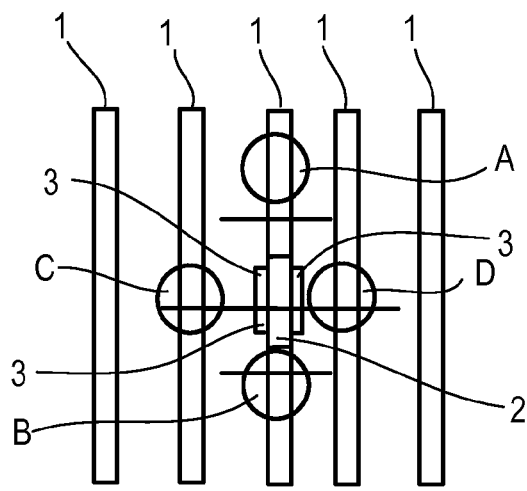
FIG. 2 is a diagram of a mask structure with a touched-up defect.

FIG. 2 exemplarily illustrates the structure of a phase shift mask. On a substrate material, which can be, for example, an alloy of tantalum and silicon dioxide, are disposed linear structures 1 made of a molybdenum-silicon alloy. The middle one of these linear structures 1 has a defect site 2. Whereas with conventional masks, which change only the intensity of the light, all that is done is to touch up the defect site so that it matches the predefined structure as closely as possible, in the case of phase shift masks the optical properties of the material are a prime consideration: besides varying the intensity, phase shift masks also spatially vary the phase. A higher resolution than with conventional masks can be achieved in this way. Phase shift masks are divided into "alternating" and "attenuating" types. Although the first-cited group of phase shift masks yields better resolution and higher precision, attenuating phase shift masks are easier to design and manufacture.

It would, of course, be desirable to repair the defect with the same material and the same dimensions, i.e., the same line diameter and the same line thickness in plan. Although line thickenings can be eliminated and the identity of the material thus preserved, it is sometimes difficult to apply the same material—i.e., in this case, molybdenum-silicon alloy—to the defect site. It is also possible to use other materials that have similar properties to molybdenum-silicon alloy in terms of refraction and absorption index or transmission or phase permeability (i.e., phase shift). A consequence of using another material is that the optical properties, particularly those influencing phase shifts, do not necessarily tally with the desired properties, assuming identical width and thickness of the line at the touched-up site.

Chromium, for example, can be used as a transmitting or light-blocking material. Chromium layers can be formed as light-blocking layers; if the structures are thin enough, then transmitting layers are obtained. Layers with a transmission of 6% of 18% are preferred.

The removal of material may also be necessary for defect repair. Material—such as chromium, for example—can be removed from the structure-forming layer. It may also be necessary to remove material from the mask substrate, for example in the case of alternating phase shift masks.

After the defect site 2 has been touched up, however, it is first necessary to define process windows for the defect site 2 and for the neighboring sites A, B, C, D surrounding it. To do this, the imaging properties of the touched-up phase shift mask are analyzed. This can, for example, be performed in a mask emulation system such as the AIMS, in which the patterning of the mask on the wafer is emulated.

The process windows are defined by taking a stack of images that includes not only the focal plane, but also planes parallel to it and outside the focus, over the entire depth of field range. It is theoretically sufficient to analyze one of the neighboring sites A to D, but the greater the number of sites used, the greater the precision of the method.

FIG. 3a illustrates such process windows for the defect ($K^D_i$, dashed lines) and exemplarily for neighboring site A ($K^N_i$, continuous lines). The x-axis is a logarithmic plot of the logarithm of the exposure, i.e., the product of the illuminance and the exposure time. The y-axis represents the focus tolerance in µm, i.e., the deviation from the plane of best focus—usually measured relative to the surface of the photoresist layer—that is still tolerable under a given illumination. The defect and the non-defect site are each represented in the graph by a respective family of three functions $K^{D,N}_i$ that differ in terms of their permissible tolerance relative to exposure. The parameter i=10, 20, 30 expresses the percentage of the permitted exposure tolerance. The higher the tolerances of the exposure, the lower the tolerance in the focal plane must be if the desired feature—in this case, a line with a width of 100 nm—is to be patterned on the photoresist or wafer with a precision of 10%. To increase the precision (not shown), the analysis extends not just to neighboring site A, but also to all the neighboring sites illustrated in FIG. 2.

In this way the process windows are defined, i.e., the ranges of exposure and focus within which the cited feature can be generated. They are depicted as rectangular boxes in FIG. 3a. It can be clearly seen that if a defect is not touched up or is inadequately touched up, assuming equal exposure tolerance, the process windows for the defect site and for the neighboring, non-defect site overlap very little or not at all. There is, therefore, a risk that the tolerance range for adjusting the exposure and the focus is too small for the parameters to be adjusted satisfactorily. In addition, the process windows for other defects may be located elsewhere, so adjustments that work for one defect may fail to correct the others.

For this reason, another repair is necessary. For small changes or fine-tuning, a suitable remedy is to apply OPC structures consisting of either transmitting or light-blocking material, such as chromium, for example. Chromium layers can be formed as light-blocking layers; if the structures are thin enough, transmitting layers are obtained. The converse, i.e., the removal of material, such as the cutting of a trench, for example, is also encompassed by these OPC structures. The width and thickness of the material can also be varied. The imaging properties are then re-analyzed, and process windows are defined as in the previous step.

FIG. 2 illustrates, by way of example, a respective OPC structure 3 to the right and to the left of the repaired defect site 2. The process windows of the repaired mask, which can be verified and released, are depicted in FIG. 3b. The process windows for the defect site and neighboring site A now overlap almost completely, and the tolerance criterion is satisfied. This provides the user with a broader range of focus and exposure settings within which the structures can be printed onto the wafer with the necessary precision.

The invention claimed is:

1. A method for repairing phase shift masks for photolithography, the method comprising:
   inspecting a phase shift mask for the presence of defects and,
   if defects are present,
   i) performing an analysis to determine which of the defects adversely affect imaging properties of the phase shift mask, ii) repairing the defects, iii) analyzing the imaging properties of the repaired phase shift mask and checking adherence to a predefined tolerance criterion, including determining, for each of the defects being repaired, a test quantity as a function of focus and exposure for the defect and at least one other, non-defect site on the phase shift mask in a vicinity of the defect, the tolerance criterion comprising a minimum allowable deviation of the test quantities for defect and non-defect sites, and iv) repeating the two previous steps, ii) and iii) if the imaging properties do not meet the predefined tolerance criterion.

2. The method of claim 1, in which the at least one other, non-defect site is selected such that the distance between the defect and the at least one other, non-defect site is large enough so that the optical image of the non-defect site is not overlain by the effect of the defect site.

3. The method of claim 1, in which repairing the defects comprises applying material that differs in transmission or phase permeability from the material of already existing structures.

4. The method of claim 1, in which repairing up the defects comprises applying light-impermeable material.

5. The method of claim 1, in which repairing the defects comprises removing material from existing structures or removing substrate material from the mask.

6. The method of claim 1, in which repairing the defects comprises adding optical proximity correction structures.

7. The method of claim 1, in which determining the test quantities comprises generating image stacks of the pattern of the phase shift mask in various planes around the focal plane and parallel thereto.

8. The method of claim 1 in which the test quantity comprises a critical dimension or an exposure tolerance.

9. The method of claim 1, comprising defining process windows for the test quantities, the tolerance criterion comprising a minimum overlap of said process windows.

10. The method of claim 1, comprising determining Bossung curves for the test quantities.

11. The method of claim 9, comprising determining an overlap of the process windows from Bossung curves for the test quantities.

12. A method for repairing a mask for photolithography, the method comprising:
    repairing a defect on a mask;
    analyzing imaging properties of the repaired mask, including
        determining a first test quantity as a function of focus and exposure for the defect,
        determining a second test quantity as a function of focus and exposure for a non-defect site on the mask in the vicinity of the defect, and
        determining whether a difference between the first and second test quantities is smaller than a threshold; and
    repeating the repairing and analyzing if the difference is not smaller than the threshold.

13. The method of claim 12, in which repairing the defect comprises at least one of (i) applying material that differs in transmission or phase permeability from the material of already existing structures, (ii) applying light-impermeable material, (iii) removing material from existing structures, (iv) removing substrate material from the mask, or (v) adding optical proximity correction structures.

14. The method of claim 12, in which determining the test quantities comprises generating image stacks of the pattern of the phase shift mask in various planes around the focal plane and parallel thereto.

15. The method of claim 12 in which the test quantity comprises a critical dimension or an exposure tolerance.

16. The method of claim 12, comprising defining process windows for the test quantities, the tolerance criterion comprising a minimum overlap of the process windows.

17. The method of claim 16, comprising determining Bossung curves for the test quantities.

18. The method of claim 17, comprising determining an overlap of the process windows from the Bossung curves.

19. A method for repairing a mask for photolithography, comprising:
    repairing a defect on a mask; and
    verifying the repair of the defect by determining whether an overlap between a first process window and a second process window is greater than a threshold, the first process window being a function of focus and exposure for the defect, the second process window being a function of focus and exposure for a non-defect site on the phase shift mask in a vicinity of the defect.

20. The method of claim 19, comprising determining Bossung curves and determining the overlap of the first and second process windows from the Bossung curves.

* * * * *

UNITED STATES PATENT AND TRADEMARK OFFICE
CERTIFICATE OF CORRECTION

| | | |
|---|---|---|
| PATENT NO. | : 8,268,516 B2 | Page 1 of 1 |
| APPLICATION NO. | : 12/742741 | |
| DATED | : September 18, 2012 | |
| INVENTOR(S) | : Axel Zibold, Peter Kuschnerus and Oliver Kienzle | |

It is certified that error appears in the above-identified patent and that said Letters Patent is hereby corrected as shown below:

Cover page, col. 1, (75) Inventors: line 3, delete "Jenna" and insert -- Jena --.

Page 2, col. 2, line 6, delete "hardward," and insert -- hardware, --.

Signed and Sealed this
Fourth Day of December, 2012

David J. Kappos
*Director of the United States Patent and Trademark Office*